(12) United States Patent
Kim

(10) Patent No.: US 7,379,148 B2
(45) Date of Patent: May 27, 2008

(54) AMORPHOUS SILICON THIN FILM TRANSISTOR-LIQUID CRYSTAL DISPLAY DEVICE AND METHOD OF MANUFACTURING THE SAME

(75) Inventor: Dong-Gyu Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 108 days.

(21) Appl. No.: 11/177,113

(22) Filed: Jul. 8, 2005

(65) Prior Publication Data

US 2005/0263762 A1  Dec. 1, 2005

Related U.S. Application Data

(63) Continuation-in-part of application No. 10/293,095, filed on Nov. 13, 2002, now Pat. No. 6,922,217.

(30) Foreign Application Priority Data

May 28, 2002  (KR) ............................... 2002-29664

(51) Int. Cl.
*G02F 1/1345* (2006.01)
*G02F 1/136* (2006.01)

(52) U.S. Cl. .................. 349/152; 349/151; 349/43; 345/204

(58) Field of Classification Search ................ 349/151, 349/152, 43; 345/204
See application file for complete search history.

(56) References Cited

U.S. PATENT DOCUMENTS 5,940,151 A * 8/1999 Ha .............................. 349/43
6,362,867 B2 * 3/2002 Maeda ........................ 349/187
6,580,423 B1 * 6/2003 Murade ....................... 345/204
6,914,655 B2 * 7/2005 Yamazaki et al. ........... 349/141
6,995,048 B2 * 2/2006 Yoneda et al. .............. 438/149
2005/0068468 A1 * 3/2005 Yamazaki et al. ............ 349/43

FOREIGN PATENT DOCUMENTS

| JP | 10-207398 | 8/1998 |
|---|---|---|
| JP | 2000-187247 | 7/2000 |
| JP | 2000-338521 | 8/2000 |
| JP | 2002-148645 | 5/2002 |

* cited by examiner

*Primary Examiner*—Huyen Ngo
(74) *Attorney, Agent, or Firm*—F. Chau & Associates, LLC

(57) ABSTRACT

In an amorphous silicon thin film transistor-liquid crystal display device and a method of manufacturing the same, gate patterns including a gate line and a gate electrode are formed on an insulation substrate having a display region and a driving circuit region on which a plurality of shift registers are formed, a gate insulating film, active layer patterns and data patterns including source and drain electrodes are formed successively on the substrate, a passivation layer on the substrate has a first contact hole exposing a drain electrode of the display region and second and third contact holes respectively exposing a gate electrode and source and drain electrodes of a first transistor of each of the shift registers, an electrode patterns on the passivation layer include a first electrode connected to the drain electrode of the display region through the first contact hole and a second electrode connecting the gate electrode to the source and drain electrodes of the first transistor through the second and third contact holes, and the gate driving circuit including the shift registers and the wirings are integrated on the insulating substrate without an additional process, thereby simplifying the manufacturing process.

18 Claims, 15 Drawing Sheets

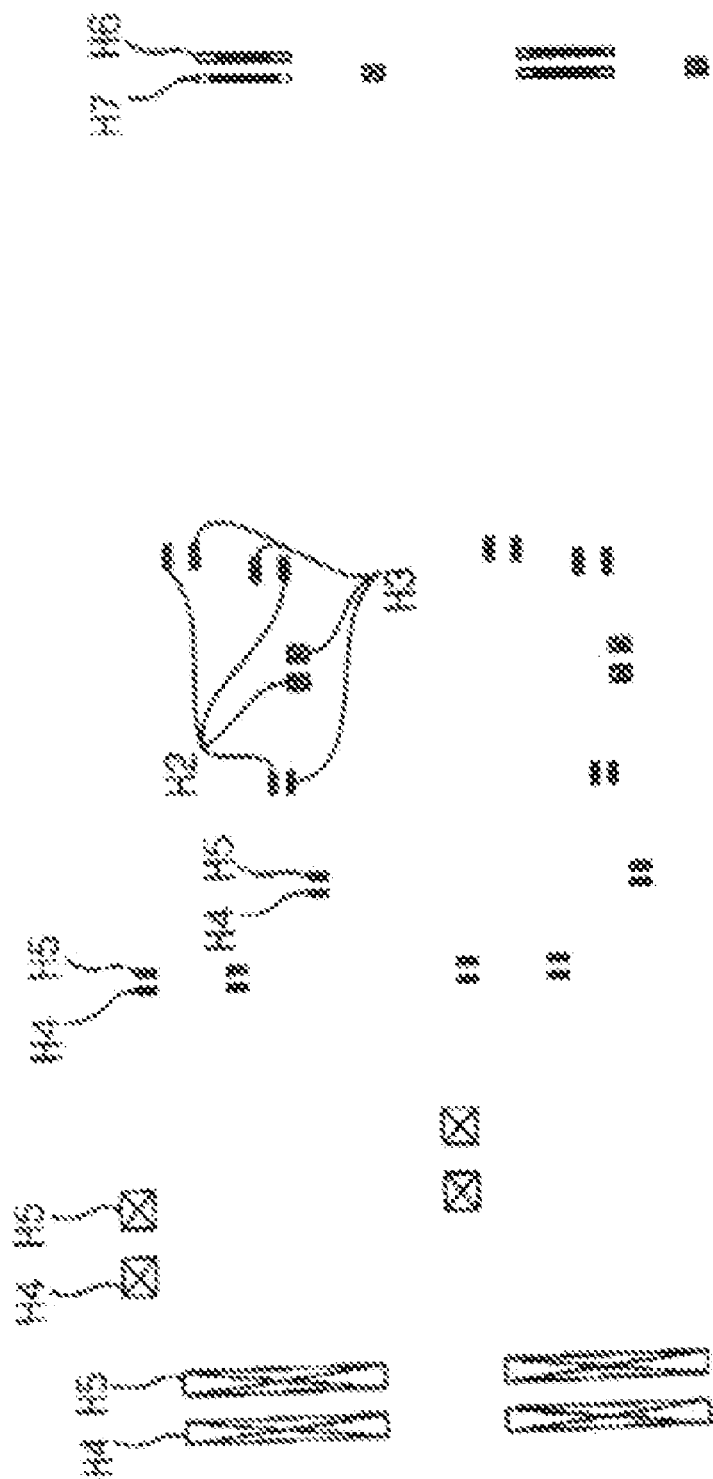

FIG. 10B
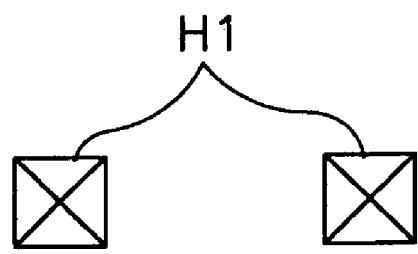
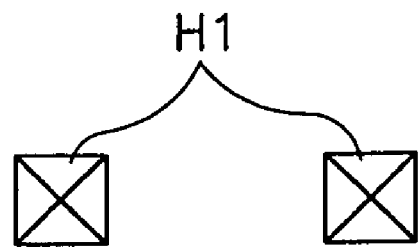

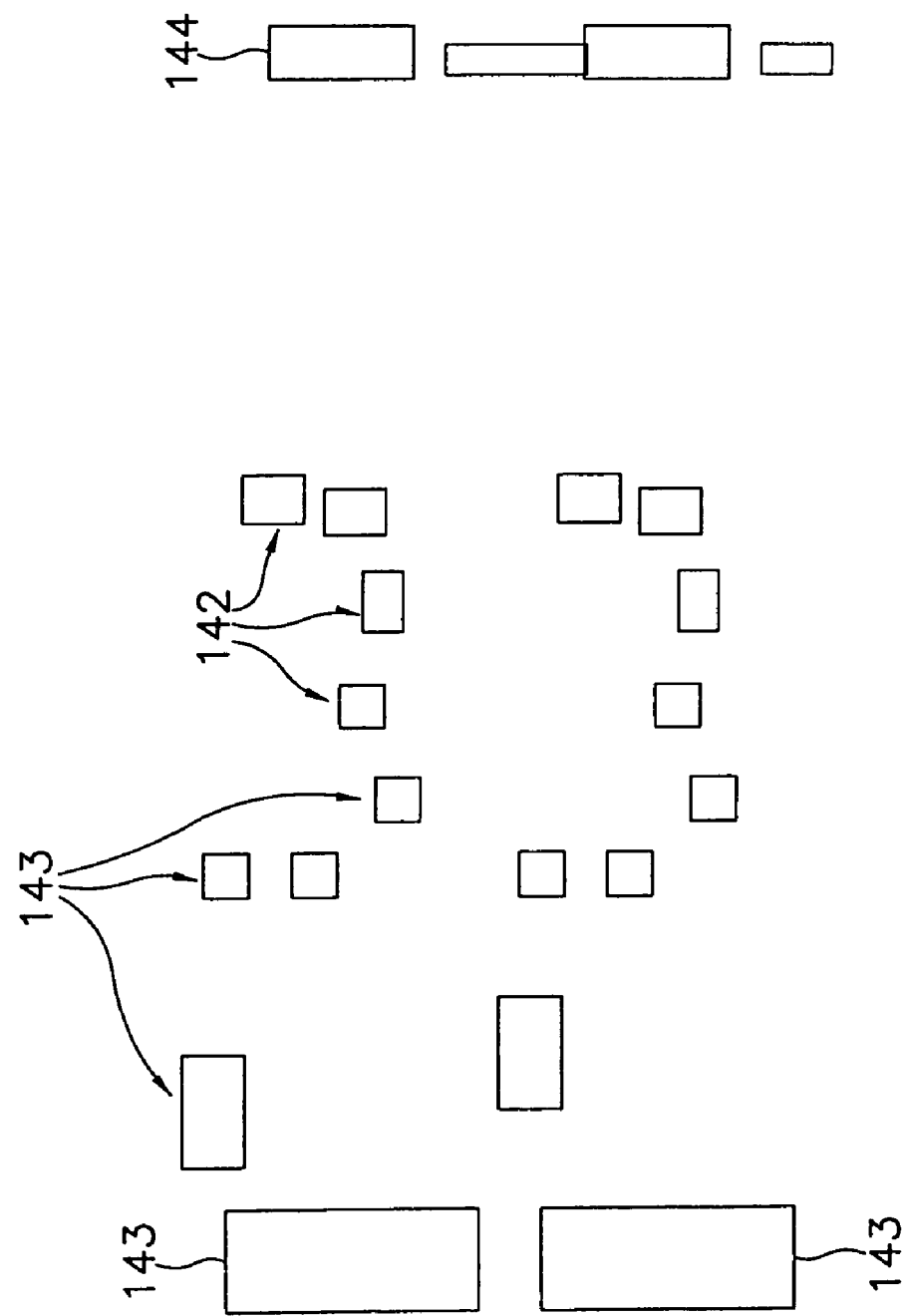

AMORPHOUS SILICON THIN FILM TRANSISTOR-LIQUID CRYSTAL DISPLAY DEVICE AND METHOD OF MANUFACTURING THE SAME

CROSS-REFERENCE TO RELATED APPLICATIONS

This application is a continuation-in-part application of U.S. patent application Ser. No. 10/293,095, filed on Nov. 13, 2002, entitled AMORPHOUS SILICON THIN FILM TRANSISTOR-LIQUID CRYSTAL DISPLAY DEVICE AND METHOD OF MANUFACTURING THE SAME, which issued on Jul. 26, 2005 as U.S. Pat. No. 6,922,217, the disclosure of which is herein incorporated by reference in its entirety, which, in turn, claims foreign priority under 35 U.S.C. § 119 to Korean Patent Application No. 2002-29664, filed on May 28, 2002, in the Korean Intellectual Property Office, the disclosure of which is herein incorporated by reference in its entirety.

BACKGROUND OF THE INVENTION

1. Field of the Invention

The present disclosure relates to a liquid crystal display ("LCD") device and a method of manufacturing the same and, more particularly, to an amorphous silicon thin film transistor-liquid crystal display device ("TFT-LCD") in which a gate driving circuit is integrated on an amorphous silicon thin film transistor ("TFT") substrate, and a method of manufacturing the same.

2. Description of the Related Art

In this information age, electronic display devices are becoming more important as information transmission media and various electronic display devices are widely applied in industrial apparatus and home appliances. Such electronic display devices are being continuously improved to have new functions appropriate for the various demands of an information society.

In general, electronic display devices display and transmit various pieces of information to users who utilize such information. That is, the electronic display devices convert electric information signals output from electronic apparatus into light information signals recognized by users through their eyes.

Electronic display devices may be categorized into emissive display device types and non-emissive display device types, where an emissive display device displays light information signals through a light emission phenomena thereof and a non-emissive display device displays the light information signals through a reflection, a scattering or an interference thereof. The emissive display device type may include a cathode ray tube ("CRT"), a plasma display panel ("PDP"), a light emitting diode ("LED") and/or an electroluminescent display ("ELD"), for example. Emissive display devices are also called active display devices.

The non-emissive display devices, which are also called passive display devices, may include a liquid crystal display ("LCD"), an electrochemical display ("ECD") and/or an electrophoretic image display ("EPID"), for example.

The CRT has been typically used as a television receiver display and as a monitor for a computer. The CRT has already been used for a long time since it generally has a relatively high quality and a low manufacturing cost. The CRT, however, has some disadvantages such as, for example, a heavy weight, a large volume and a high power dissipation.

Recently, the demand for improved electronic display devices has led to great interest in devices such as flat panel displays, which can offer excellent characteristics including thin thickness, light weight, low driving voltage and low power consumption. Such flat panel display devices may be manufactured according to improved semiconductor technologies.

In the flat panel devices, a liquid crystal display ("LCD") device has been widely utilized for various electronic devices because the LCD device offers a thin thickness and a low power dissipation while maintaining a relatively high display quality approximately equal to that of a CRT. In addition, the LCD device can be operated under a low driving voltage, and can be easily manufactured such that the LCD device is widely used for various electronic apparatuses.

The LCD typically comprises two substrates, each of the substrates having an electrode, with a liquid crystal layer interposed therebetween. In the LCD, a voltage is applied across the electrodes to realign liquid crystal molecules and control an amount of light transmitted through the molecules.

With typical LCDs, the device typically includes electrodes formed on each of two substrates and a thin film transistor for switching a voltage applied to each of the electrodes. Generally, the thin film transistor is formed on one of the two substrates.

The LCD device types utilizing the thin film transistor in a pixel region may be divided into an amorphous silicon type TFT-LCD and a polycrystalline silicon type TFT-LCD. The polycrystalline silicon TFT-LCD device has a relatively low power consumption and cost, but the polycrystalline silicon type TFT-LCD manufacturing process is complicated compared to that of the amorphous silicon type TFT-LCD device. Accordingly, the polycrystalline silicon TFT-LCD is mainly used for small-sized displays such as, for example, mobile telephones. The amorphous silicon TFT-LCD is suitable for a large-sized displays and has a high yield, so it is used for displays having a large screen such as, for example, a notebook personal computer ("PC"), an LCD monitor, a high definition television ("HDTV") receiver monitor, and the like.

As shown in FIG. 1 for a typical polycrystalline silicon TFT-LCD device, a data driving circuit 12 and a gate driving circuit 14 are formed on a glass substrate 10 on which pixel arrays are formed. A terminal 16 is connected to an integrated printed circuit board ("PCB") 20 through a film cable 18. This structure can, reduce manufacturing costs and minimize the power loss by integrating the driving circuits.

As shown in FIG. 2 for a typical amorphous silicon TFT-LCD device, a data driving chip 34 is formed on a flexible PCB 32 by a chip on film ("COF") method and a data PCB 36 is connected to a data line terminal of pixel array through the flexible PCB 32. Further, a gate driving chip 40 is formed on a flexible PCB 38 by the COF method, and a gate PCB 42 is connected to a gate line terminal of pixel array through the flexible PCB 38.

A recently suggested method is an integrated PCB technology wherein a gate power supply is mounted on a data PCB to thereby eliminate a gate PCB. Korea Patent Laid-Open Publication Number 2000-66493 disclosed an LCD module adopting an integrated PCB from which the gate PCB is removed.

However, even if the integrated PCB is adopted, a flexible PCB on which a gate driving circuit is formed is still used. Accordingly, since a process of assembling a plurality of flexible PCBs on a glass substrate is carried out in the manufacture of amorphous silicon TFT-LCD devices, an outer lead bonding ("OLB") process is more complicated as compared to the polycrystalline silicon TFT-LCD, thereby raising the manufacturing cost.

SUMMARY OF THE INVENTION

Embodiments of the present disclosure provide an amorphous silicon TFT-LCD device in which a gate driving circuit is integrated on an amorphous silicon TFT substrate. The present disclosure also provides for a method of manufacturing an amorphous silicon TFT-LCD device in which a gate driving circuit is integrated on an amorphous silicon TFT substrate.

An embodiment is provided wherein an amorphous silicon TFT-LCD device comprising an insulating substrate including a display region on which a pixel array is formed and a driving circuit region on which a plurality of shift registers are formed. A gate pattern is formed on the substrate and includes a gate line and a gate electrode. A gate insulating film is formed on the substrate including the gate pattern. An active layer pattern is formed on the gate insulating film and a data pattern is formed on the substrate and the active layer pattern. The data pattern includes a source electrode making contact with a first region of the active layer pattern, a drain electrode making contact with a second region of the active layer pattern and a data line connected to the drain electrode. A passivation layer is formed on the substrate including the data pattern and has a first contact hole exposing the drain electrode of the display region, a second contact hole exposing the gate electrode of a first transistor of each of the shift registers and a third contact hole exposing the source and drain electrodes of the first transistor. An electrode pattern is formed on the passivation layer and includes a first electrode connected to the drain electrode of the display region through the first contact hole and a second electrode connecting the gate electrode and the source and drain electrodes of the first transistor to each other through the second and third contact holes.

In addition, an embodiment of the present disclosure is realized by an amorphous silicon TFT-LCD device comprising an insulating substrate including a display region on which a plurality of gate lines and a plurality of data lines are formed and a gate driving circuit region. Shift registers are formed on the substrate of the gate driving circuit region that include a number of thin film transistors having a gate electrode and source and drain electrodes. The shift registers sequentially select gate lines. Main wirings are disposed on the substrate of the gate driving circuit region to apply a signal to each of the shift registers and formed of the same layer from a first shift register to a last shift register. A passivation layer is formed on the substrate including the shift registers and the main wirings and has a first contact hole partially exposing a data line of the display region, a second contact hole exposing a gate electrode of a first transistor of each of the shift registers and a third contact hole exposing the source and drain electrodes of the first transistor. An electrode pattern is formed on the passivation layer and includes a first electrode connected with the data line of the display region through the first contact hole and a second electrode connecting the gate electrode and the source and drain electrodes of the first transistor to each other through the second and third contact holes.

An exemplary embodiment substrate for a display device is provided, comprising: a base substrate including a display region and a driving circuit region; a plurality of switching transistors formed in the display region, each of the switching transistors including amorphous silicon; a plurality of driving transistors formed in the driving circuit region, each of the driving transistors including amorphous silicon; a protection layer formed on the base substrate to cover the switching transistors and the driving transistors; and an electrode pattern formed on the protection layer, the electrode pattern including a pixel electrode electrically connected to one of the switching transistors, and a connecting electrode electrically connecting two of the driving transistors.

An alternate embodiment substrate is provided wherein the electrode pattern comprises an optically transparent and electrically conductive material. Still another alternate embodiment substrate is provided wherein the electrode pattern comprises at least one of ITO (Indium Tin Oxide) and IZO (Indium Zinc Oxide).

An alternate embodiment substrate is provided, further comprising main signal lines for applying signals to the driving transistors, wherein the main signal lines comprise a first signal line being adjacent to the driving transistors and having a first width, and a second signal line being adjacent to the first wiring having a second width that is wider than the first width. Still another alternate embodiment substrate is provided wherein each of the driving transistors and the switching transistors comprises a gate electrode, a drain electrode and a source electrode, and the gate electrode and the main signal lines are made of a same material. Yet another alternate embodiment substrate is provided, further comprising a branch signal line extended from one of the drain electrode and the source electrode, the branch signal line including a wiring portion having a third width, and a connecting pad portion having a fourth width that is wider than the third width. A further alternate embodiment substrate is provided wherein the connecting pad portion is electrically connected to the connecting electrode.

An exemplary embodiment liquid crystal display (LCD) device is provided, comprising: a first substrate including: a base substrate including a display region and a driving circuit region; a plurality of switching transistors formed in the display region, each of the switching transistors including amorphous silicon; a plurality of driving transistors formed in the driving circuit region, each of the driving transistors including amorphous silicon; and a protection layer formed on the base substrate to cover the switching transistors and the driving transistors; a pattern including a pixel electrode electrically connected to one of the switching transistors, and a connecting electrode electrically connecting two of the driving transistors; a second substrate facing the first substrate; and a liquid crystal layer disposed between the first and the second substrates.

An alternate embodiment LCD is provided wherein the electrode pattern comprises an optically transparent and electrically conductive material. Yet another alternate embodiment LCD is provided wherein the electrode pattern comprises at least one of ITO (Indium Tin Oxide) and IZO (Indium Zinc Oxide). Still another alternate embodiment LCD is provided, further comprising main signal lines for applying signals to the driving, wherein the main signal lines comprise a first signal line being adjacent to the driving transistors and having a first width, and a second signal line being adjacent to the first wiring having a second width that is wider than the first width. A further alternate embodiment LCD is provided wherein each of the driving transistors and the switching transistors comprises a gate electrode, a drain electrode and a source electrode, and the gate electrode and the main signal lines are made of a same material. Still another alternate embodiment LCD is provided, further comprising a branch signal line extended from one of the drain electrode and the source electrode, the branch signal line including a wiring portion having a third width, and a connecting pad portion having a fourth width that is wider than the third width. A further alternate embodiment LCD is provided wherein the connecting pad portion is electrically connected to the connecting electrode.

An exemplary embodiment method of manufacturing a substrate for a display device is provided, comprising: forming a gate electrode layer on a base substrate having a display region and a driving circuit region; patterning the gate electrode layer to form gate electrodes of switching transistors in the display region, gate electrodes of driving transistors in the driving circuit region and a main signal line in the driving circuit region; forming a gate insulation layer on the base substrate to cover the gate electrodes of the driving transistors and the switching transistors, and the main signal line; forming an active layer pattern on the gate insulation layer; forming a data electrode layer on the active layer pattern and the gate insulation layer; patterning the data electrode layer to form drain and source electrodes of the switching transistors in the display region, drain and source electrodes of the driving transistors in the driving circuit region, and a branch signal line extended from one of the drain and source electrodes of the driving transistors; forming a passivation layer on the base substrate; forming a first contact hole that exposes a portion of the main signal line, and a second contact hole that exposes a portion of the branch signal line; forming a electrode layer on the passivation layer; and patterning the electrode layer to form pixel a electrode electrically connected to one of the drain electrodes of the switching transistors, a first connecting electrode connecting two of the driving transistors, and a second connecting electrode connecting the main signal line and one of the driving transistors.

An alternate embodiment method is provided wherein the pixel electrode pattern comprises metal. Another alternate embodiment method is provided wherein the electrode pattern comprises an optically transparent and electrically conductive material.

An alternate embodiment method is provided wherein the gate electrode layer comprises a chromium (Cr) metal layer and aluminum (Al)-including metal layer. A further alternate embodiment method is provided wherein a thickness of the aluminum-including metal layer is thicker than a thickness of the chromium metal layer. Yet another alternate embodiment method is provided wherein the data electrode layer comprises a chromium metal layer and has a thickness of about 1500 Angstroms to about 4000 Angstroms.

A method of manufacturing an amorphous silicon TFT-LCD device is also provided. After forming a gate pattern including a gate line and a gate electrode on an insulating substrate having a display region on which a pixel array is formed and a driving circuit region on which a plurality of shift registers are formed, a gate insulating film is formed on the substrate including the gate pattern. An active layer pattern is formed on the gate insulating film above the gate electrode. A data pattern is formed on the substrate and the active layer pattern. The data pattern includes a source electrode making contact with a first region of the active layer pattern, a drain electrode making contact with a second region of the active layer pattern and a data line connected with the drain electrode. After forming a passivation layer on the substrate including the data pattern, the passivation layer and the gate insulating film are etched to form a first contact hole exposing the drain electrode of the display region, a second contact hole exposing the gate electrode of a first transistor of each of the shift registers, and a third contact hole exposing source and drain electrodes of the first transistor. Thereafter, an electrode pattern is formed on the passivation layer. The electrode pattern includes a first electrode connected with the drain electrode of the display region through the first contact hole and a second electrode connecting the gate electrode and the source and drain electrodes of the first transistor to each other through the second and third contact holes.

In addition, a method of manufacturing an amorphous silicon TFT-LCD device is provided wherein a gate pattern is formed. The gate pattern includes a gate line and a gate electrode on an insulating substrate having a display region on which a pixel array is formed and a driving circuit region on which a plurality of shift registers are formed. After forming a gate insulating film on the substrate including the gate pattern, an active layer pattern and a data pattern on the gate insulating film using one mask are formed. The data pattern includes a source electrode making contact with a first region of the active layer pattern, a drain electrode making contact with a second region of the active layer pattern and a data line connected with the drain electrode. A passivation layer is formed on the substrate including the data pattern. The passivation layer and the gate insulating film are etched to form a first contact hole exposing the drain electrode of the display region, a second contact hole exposing the gate electrode of a first transistor of each of the shift registers, and a third contact hole exposing source and drain electrodes of the first transistor. Then, an electrode pattern is formed on the passivation layer. The electrode pattern includes a first electrode connected with the drain electrode of the display region through the first contact hole and a second electrode connecting the gate electrode and the source and drain electrodes of the first transistor to each other through the second and third contact holes.

According to an amorphous silicon TFT-LCD device of the present disclosure, without an additional process, the gate driving circuit including the shift registers and the wirings is integrated on the insulating substrate on which a pixel array is formed. That is, several layers, which can be comprised of the same material, are formed of the same layer to thereby decrease the number of mask. Further, a conductive film for pixel electrode connects the gate electrode and source and drain electrodes of the first transistor constituting the shift registers in the gate driving circuit with each other, thereby simplifying the manufacturing process.

Further, the main wirings for applying a signal to each of the shift registers are formed of the same layer from the first shift register to the last shift register, so that the resistance of the main wiring is minimized to increase field effect mobility of the amorphous silicon TFT-LCD.

BRIEF DESCRIPTION OF THE DRAWINGS

The above and other features and advantages of the present disclosure will become more apparent by describing preferred embodiments thereof in detail with reference to the accompanying drawings in which:

FIGS. 8A to 11B are plan views illustrating a method of manufacturing an amorphous silicon TFT-LCD device in accordance with an embodiment of the present disclosure.

DESCRIPTION OF PREFERRED EMBODIMENTS

For an exemplary amorphous silicon TFT-LCD device type according to an embodiment of the present disclosure, a method is provided whereby the driving circuits and the pixel array are simultaneously formed on a substrate to thereby decrease the number of assembly process steps to a number comparable with that of the polycrystalline silicon TFT-LCD device type. Hereinafter, a preferred embodiment of the present disclosure will be described in detail with reference to the accompanying drawings.

Figure 1:
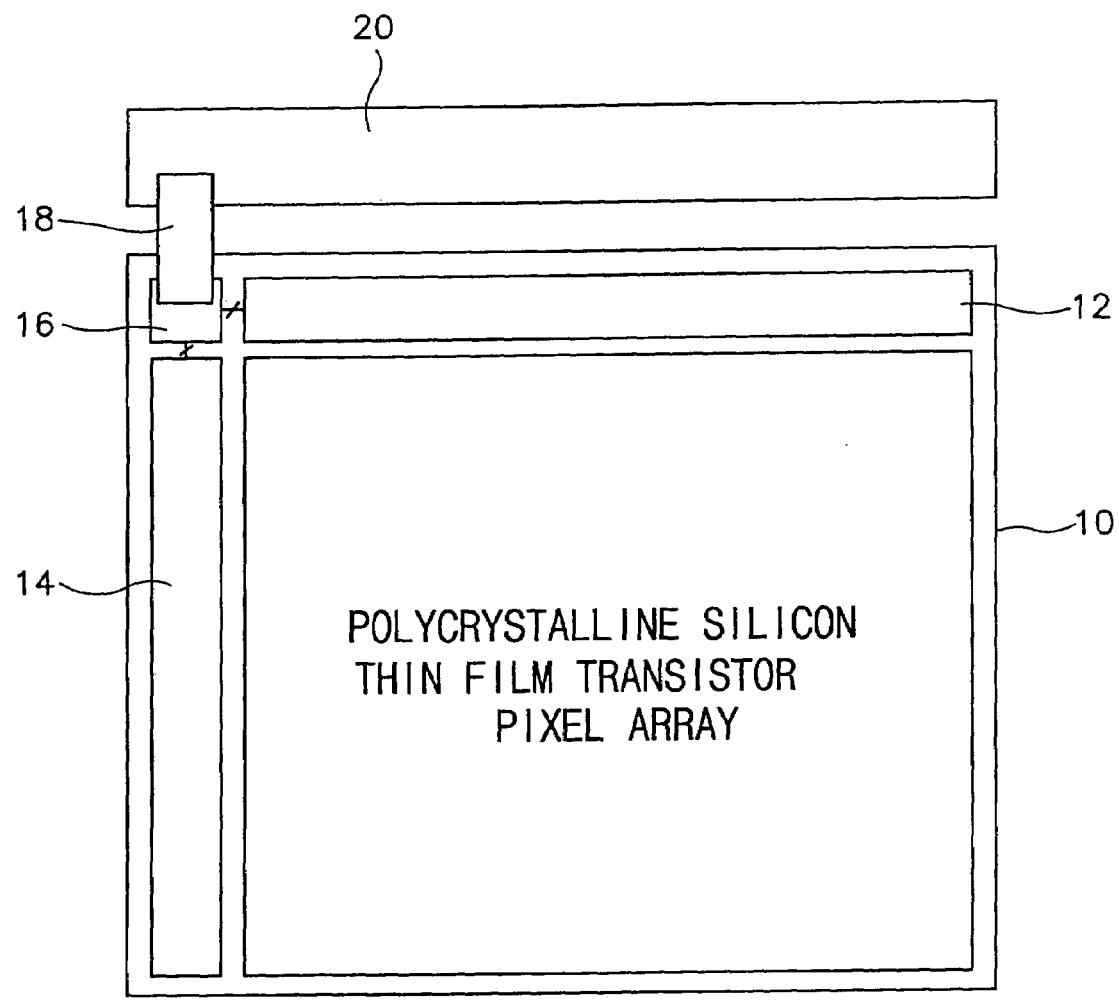
FIG. 1 is a plan view schematically illustrating a conventional polycrystalline silicon TFT-LCD device.
Figure 2:
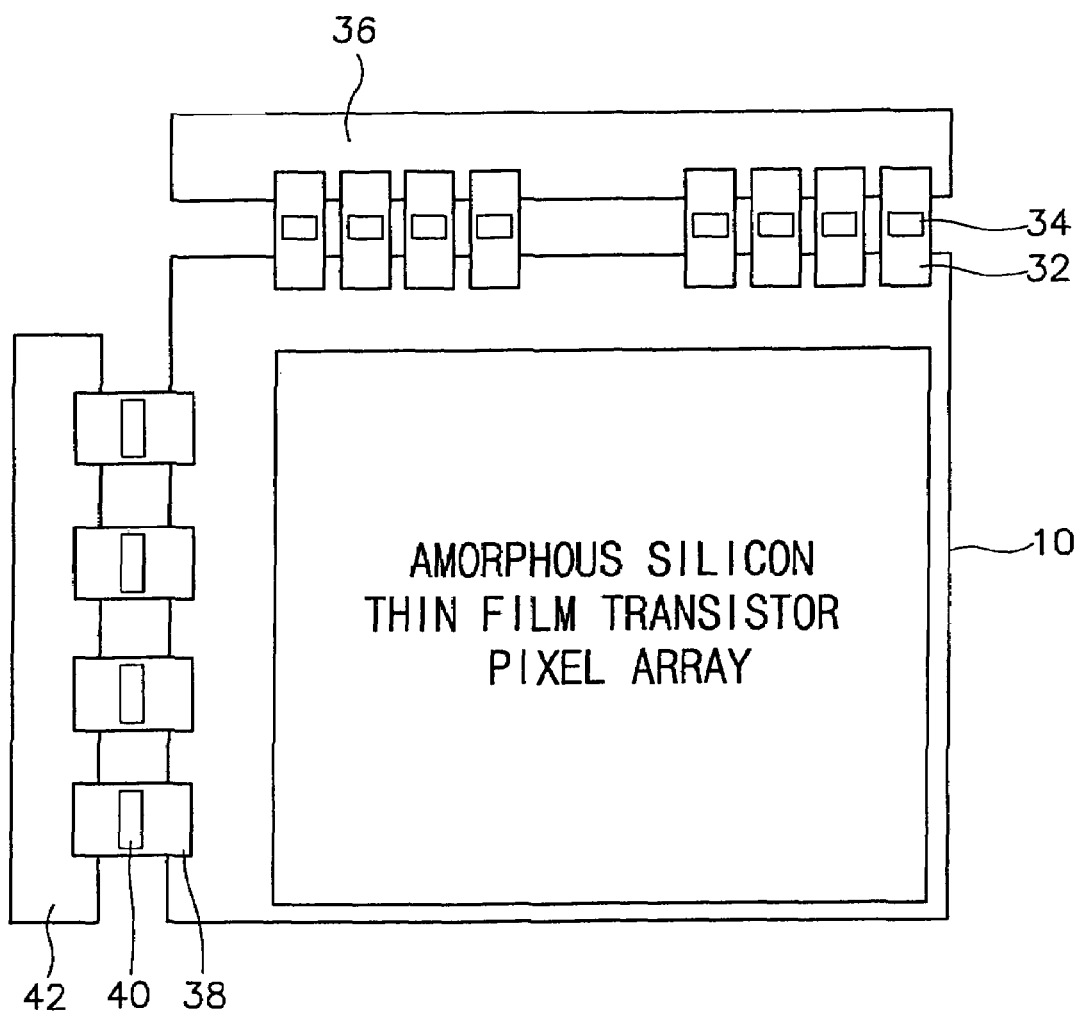
FIG. 2 is a plan view schematically illustrating a conventional amorphous silicon TFT-LCD device.
Figure 3:
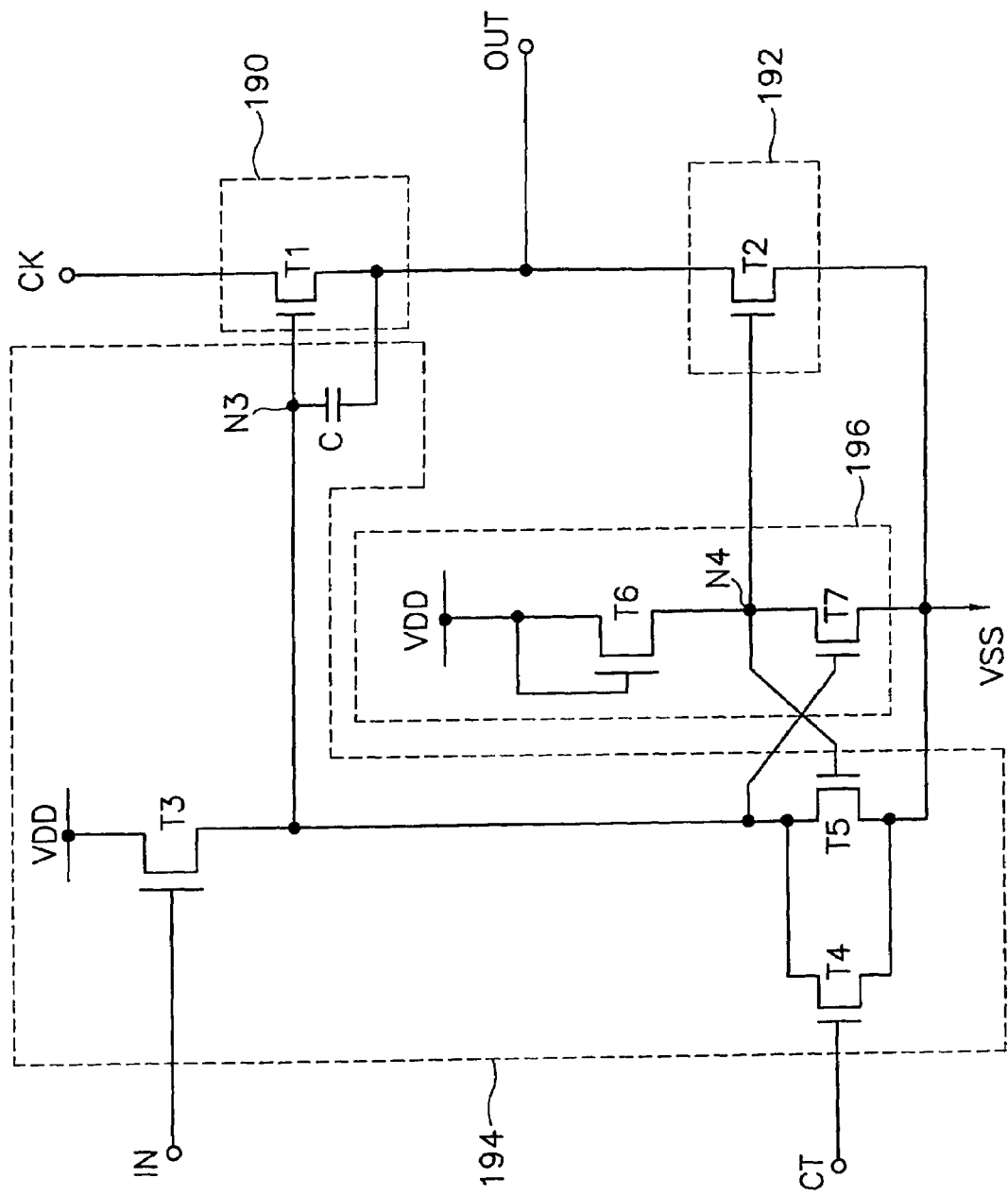
FIG. 3 is a circuit diagram of shift registers applied to a gate driving circuit region in an amorphous silicon TFT-LCD device according to an embodiment of the present disclosure.
Figure 4:
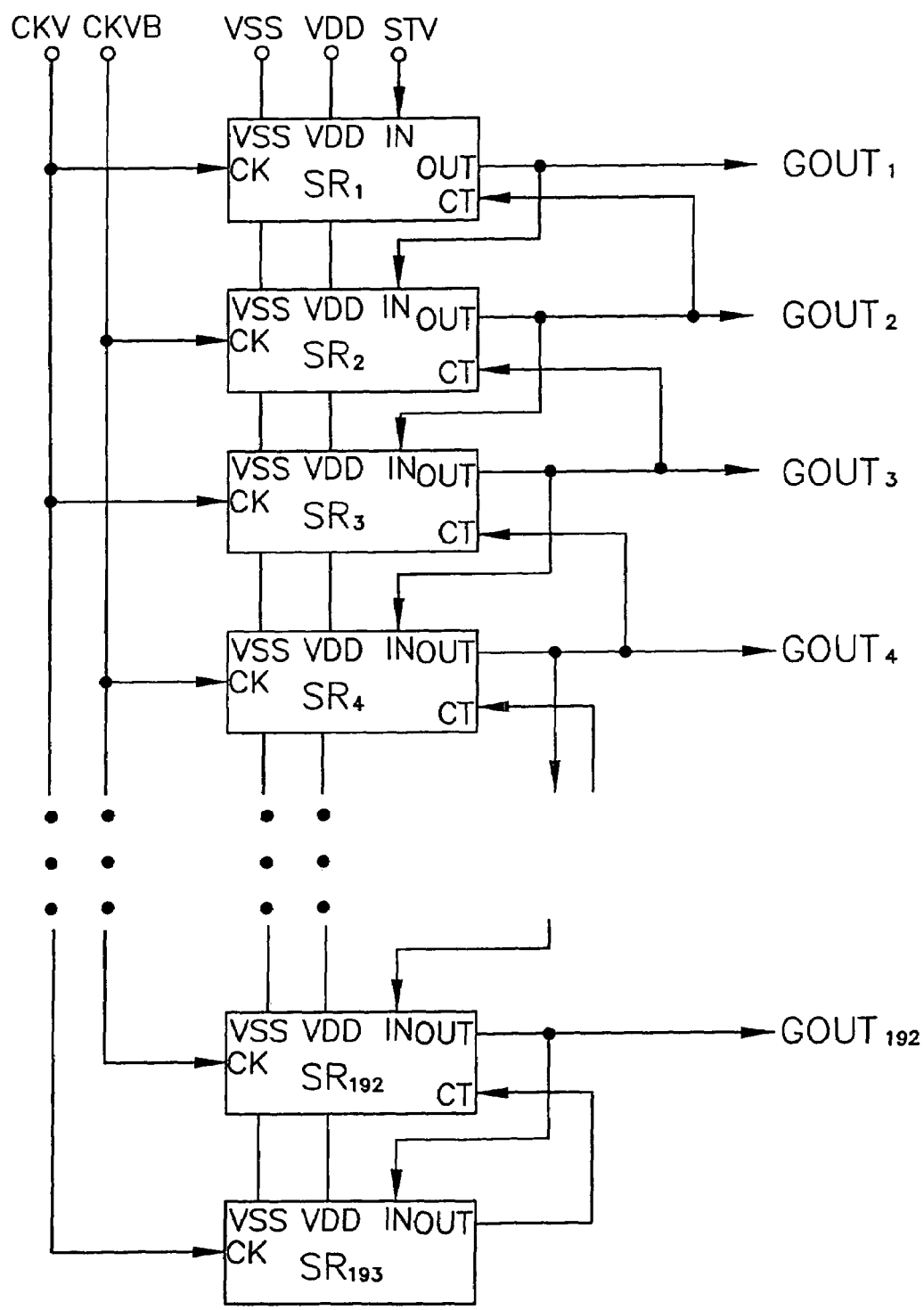
FIG. 4 is a block diagram of the shift registers of FIG. 3.

FIG. 3 is a circuit diagram of a shift register as applied to a gate driving circuit region in an amorphous silicon TFT-LCD device according to an embodiment of the present disclosure. FIG. 4 is a block diagram of a number of interconnected shift registers of FIG. 3.

Referring to FIGS. 3 and 4, the gate driving circuit has a plurality of shift registers ($SR_1$, $SR_2$, ... $SR_{193}$) connected subordinately. That is, an output terminal ("OUT") of each of the shift registers is connected to an input terminal ("IN") of the next shift register. There are 192 shift registers ($SR_1$ through $SR_{192}$) corresponding to 192 gate lines and one dummy shift register ("$SR_{193}$"). Each of the shift registers has an input terminal ("IN"), an output terminal ("OUT"), a control terminal ("CT"), a clock signal input terminal ("CK"), a first power source terminal ("VSS") and a second power source terminal ("VDD").

A start signal ("ST") is input to the input terminal ("IN") of the first shift register ("$SR_1$"). The output signal ($GOUT_1$ through $GOUT_{192}$, respectively) of each of the shift registers is connected to the corresponding gate line, and then, a plurality of gate lines are sequentially selected by the output signal. A first clock signal ("CKV") is provided to the odd-numbered shift registers, while a second clock signal ("CKVB") is provided to the even-numbered shift registers. The phase of the first clock signal ("CKV") is reverse to that of the second clock signal ("CKVB").

Each of the shift registers includes a pull-up section 190, a pull-down section 192, a pull-up driving section 194 and a pull-down driving section 196.

The pull-up section 190 provides a corresponding clock signal of the first and second clock signals to the output terminal ("OUT"). The pull-down section 192 provides the first power source ("VSS") to the output terminal ("OUT").

The pull-up driving section 194 is connected to the input node of the pull-up section 190 such that it responds to the end of the input signal to charge a capacitor for turning on the pull-up section 190 and responds to the end of the output signal of the next shift register to discharge the capacitor for turning off the pull-up section 190.

The pull-down driving section 196 is connected to the input node of the pull-down section 192 such that it responds to the end of the input signal to turn on the pull-down section 192 and responds to the end of the output signal of next shift register to turn off the pull-down section 192.

The pull-up section 190 includes a first driving transistor T1 having a drain connected to the clock signal input terminal CK, a gate connected to a third node N3 and a source connected to the output terminal OUT.

The pull-down section 192 includes a second driving transistor T2 having a drain connected to the output terminal OUT, a gate connected to a forth node N4, and a source connected to the clock signal input terminal CK.

The pull-up driving section 194 includes a capacitor C and three control transistors T3, T4 and T5. The capacitor C is connected between the third node N3 and the output terminal OUT. A third control transistor T3 has a drain connected to the second power source VDD, a gate connected to the input terminal IN and a source connected to the third node N3. A forth control transistor T4 has a drain connected to the third node N3, a gate connected to the control terminal CT and a source connected to the first power source VSS. A fifth control transistor T5 has a drain connected to the third node N3, a gate connected to the forth node N4 and a source connected to the first power source VSS.

The pull-down driving section 196 includes two control transistors T6 and T7. The drain and gate of the sixth control transistor T6 are connected to the second power source VDD in common, while the source of the sixth control transistor T6 is connected to the forth node N4. The seventh control transistor T7 has a drain connected to the forth node N4, a gate connected to the third node N3 and a source connected to the first power source VSS.

Figure 5:
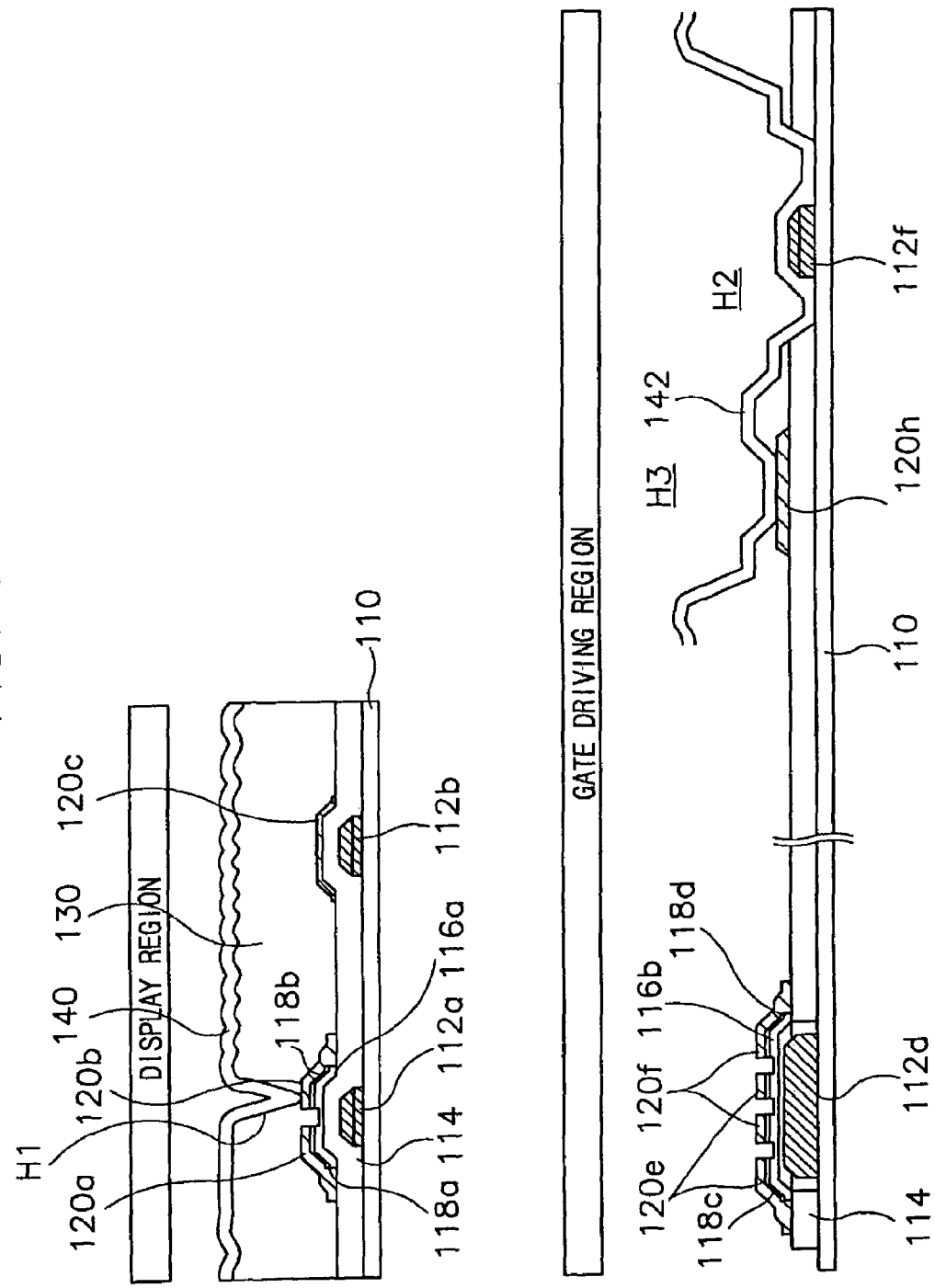
FIG. 5 is a cross-sectional view of an amorphous silicon TFT-LCD device in accordance with an embodiment of the present disclosure.
Figure 6:
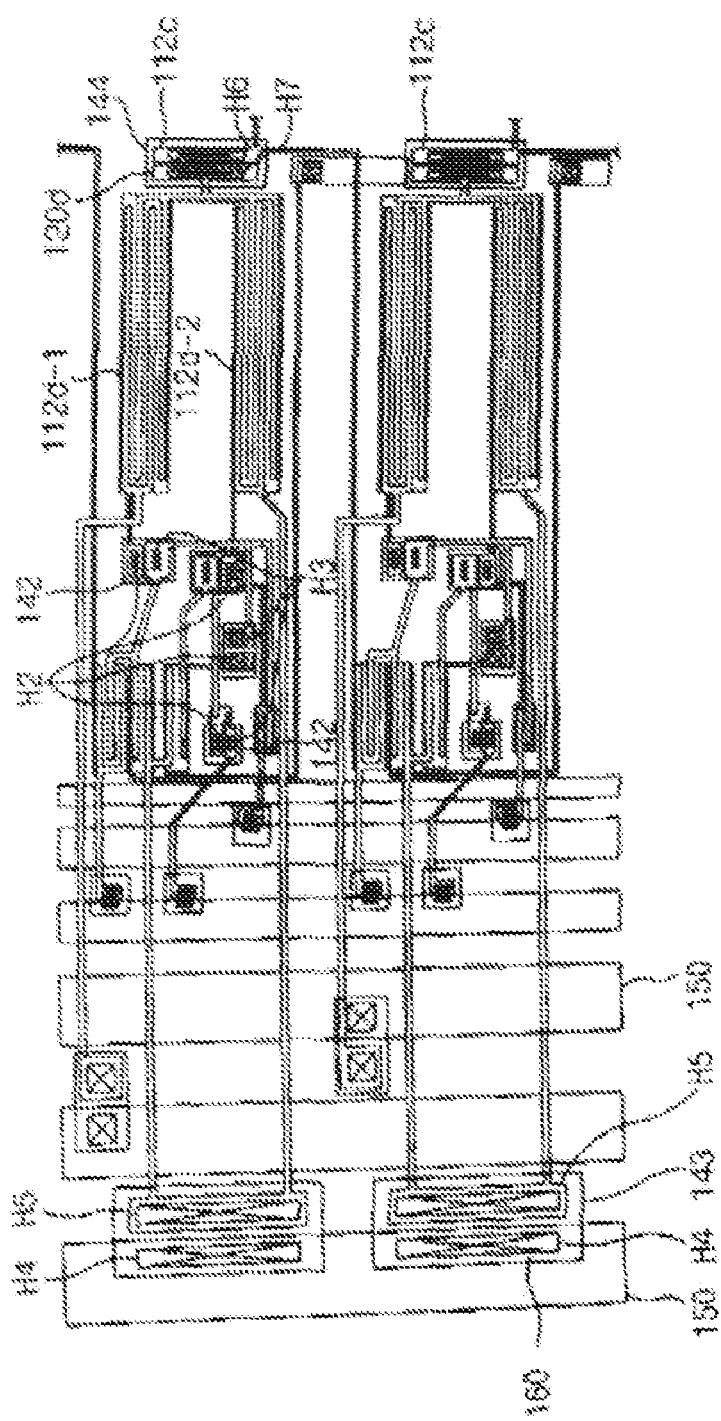
FIG. 6 is a plan view illustrating a gate driving circuit region of an amorphous silicon TFT-LCD device according to an embodiment of the present disclosure.

FIG. 5 is a cross-sectional view of the amorphous silicon TFT-LCD device according to one embodiment of the present disclosure, and illustrates a display region and a gate driving circuit region. FIG. 6 is a plan view of the gate driving circuit region, and FIG. 7 is a plan view of the display region.

Figure 7:
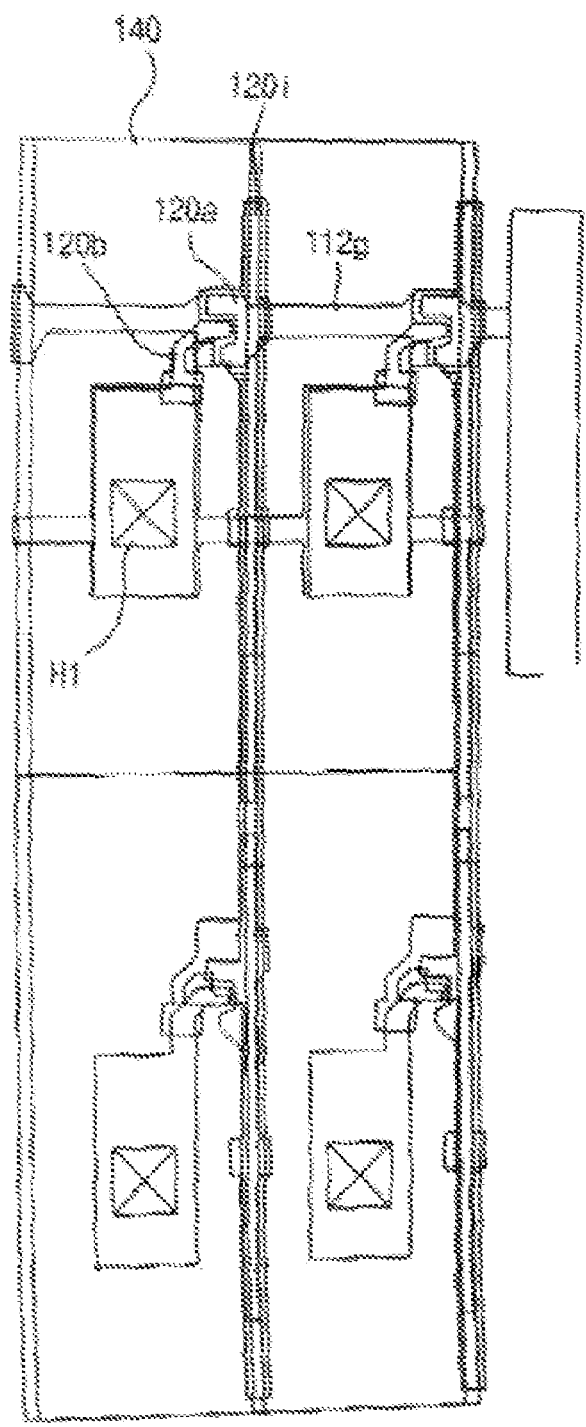
FIG. 7 is a plan view illustrating a display region of an amorphous silicon TFT-LCD device according to an embodiment of the present disclosure.

Referring to FIGS. 5 through 7, gate patterns 112a, 112b, 112c, 112d, 112e, 112f and 112g are disposed on the display region and the gate driving circuit region of an insulating substrate 110. Each of the gate patterns includes a gate line 112g and a gate electrode branched from the gate line 112g. Also, the gate pattern 112b in the display region is provided as a lower electrode of a storage capacitor. Between the display region and the gate driving circuit region, a gate pad 112c is formed of the same layer as in the gate pattern. The gate pad 112c is connected to one end of the gate line 112g and applies a scanning signal to the gate line 112g by receiving the scanning signal from an external source. Preferably, the gate patterns 112a, 112b, 112c, 112d, 112e, 112f and 112g are formed of a composite film consisting of a chrome ("Cr") layer having a thickness of about 500 Å and an aluminum-neodymium ("AlNd") having a thickness of about 200 Å.

A gate insulating film 114 is formed on the entire surface of the substrate 100 including the gate patterns 112a, 112b, 112c, 112d, 112e, 112f and 112g. The gate insulating film 114 preferably has a thickness of about 4500 Å and comprises silicon-nitride ("SiNx").

On the gate insulating film 114 of the display region and the gate driving circuit region, there are disposed active layer patterns including first impurity regions 118a and 118c, second impurity regions 118b and 118d, and channel regions 116a and 116b formed between the first impurity regions and the second impurity regions. The channel regions 116a and 116b comprises amorphous silicon and has a thickness of about 200Å, and the first and second impurity regions 118*a*, 118*b*, 118*c* and 118*d* comprises n-type amorphous silicon and have a thickness of about 500 Å.

Data patterns 120*a*, 120*b*, 120*c*, 120*e*, 120*f*, 120*h* and 120*i* are disposed on the active layer patterns. The data patterns include source electrodes 120*a* and 120*e* respectively making contact with the first impurity regions 118*a* and 118*c*, drain electrodes 120*b* and 120*f* respectively making contact with the second impurity regions 118*b* and 118*d*, and a data line 120*i* connected to the source electrodes 120*a* and 120*e* and formed perpendicular to the gate line 112*g*. Above the capacitor lower electrode 112*b*, there is disposed a capacitor upper electrode 120*c* comprising the same layer as in the data patterns with the gate insulating film 114 interposed therebetween. On the pad region between the display region and the gate driving circuit region, there is formed a data pad 120*d* comprising the same layer as in the data patterns. Preferably, the data patterns 120*a*, 120*b*, 120*c*, 120*d*, 120*e*, 120*f* and 120*g* are comprised of chrome ("Cr") film having a thickness of about 1500 to about 4000 Å.

The gate electrode 112*d* constituting the thin film transistor of the gate driving circuit region is formed to a box structure and the source and drain electrodes 120*e* and 120*f* are formed to an interdigital structure having multi-channels. Being spaced apart from each other, the odd-numbered source electrode 120*e* and the even-numbered drain electrode 120*f* are disposed by turns.

As shown in FIG. 6, driving transistors (T1 and T2 of FIG. 3) of the shift registers are disposed on a portion of the gate driving circuit region adjacent to the display region. The driving transistors apply selectively signals of Von and Voff to the gate output terminal. On a part of the gate driving circuit region farthest away from the display region, there are disposed main wirings 150 (VSS, CK, CKB, VDD and VSS2) applying the signal to each of the shift registers. Control transistors (T3, T4, T5, T6 and T7 of FIG. 3) are disposed between the driving transistor region and the wiring region.

Typically, in the case that a gate output signal is formed using the shift registers in the large-sized and fine-pitched TFT-LCD device in which a gate-on time is short and an RC delay of the gate line is very long, the resistance of the main wirings applying the signals to each of the shift registers and the load capacitor should be minimized because the field effect mobility of the amorphous silicon TFT is very low. Accordingly, in the present disclosure, the first shift register through the last shift register, which correspond to the main wirings 150, are formed of the same layer without an additional contact, thereby minimizing the resistance of the main wiring 150. Preferably, to reduce the wiring resistance, the main wirings 150 are formed of a metal film having a lower sheet resistance than the metal films constituting the gate patterns 112*a*, 112*b*, 112*c*, 112*d*, 112*e*, 112*f* and 112*g* and the data patterns 120*a*, 120*b*, 120*c*, 120*d*, 120*e*, 120*f* and 120*g*. In the present disclosure, the main wiring 150 is formed of the same layer as in the gate patterns because the gate patterns are comprised of aluminum ("Al") and the data patterns are comprised of chrome ("Cr").

In addition, branch wirings 160 for connecting the main wiring 150 to the transistor terminals T1 through T7 of each of the shift registers are formed of a different layer from the main wirings 150. Accordingly, if the main wirings 150 are formed of the same layer as in the gate pattern, the branch wirings 160 are formed of the same layer as in the data pattern. Also, to reduce the capacitance of the main wirings 150, it is preferred that a portion of the branch wiring 160*s* where the branch wiring 160 and the main wiring 150 cross each other is formed to have a narrow line width.

On the entire surface of the substrate 110, including the data patterns 120*a*, 120*b*, 120*c*, 120*e*, 120*f*, 120*h* and 120*i*, there is formed a passivation layer 130 having a first contact hole H1 exposing the drain electrode 120*b* of the display region, a second contact hole H2 exposing a contact gate pattern 112*f* in the gate driving circuit region, a third contact hole H3 exposing a contact data pattern 120*h* in the gate driving circuit, a forth contact hole H4 exposing one of the main wirings 150 and a fifth contact hole H5 exposing one of the branch wirings 160. Also, through the passivation layer 130 of the pad region, there are formed a sixth contact hole H6 exposing the gate pad 112*c* and a seventh contact hole H7 exposing the data pad 112*d*. The passivation layer 130 is comprised of silicon nitride or a photosensitive organic material. Especially in a reflection-type LCD having a reflective electrode of uneven-shape for increasing the reflectivity, the passivation layer is preferably formed of a photosensitive organic film having an uneven surface with prominences and recesses.

The electrode patterns 140, 142 and 143 are formed on the passivation layer 130 including the first to fifth contact holes H1, H2, H3, H4 and H5. The electrode patterns include a pixel electrode (or a first electrode) 140 electrically connected with the drain electrode 120*b* of the display region, a second electrode 142 electrically connecting the gate pattern 112*f* for contact and the data pattern 112*h* for contact in the gate driving circuit region through the second and third contact holes H2 and H3, respectively, a third electrode 143 electrically connecting the main wiring 150 and the branch wiring 160 in the gate driving circuit region through the forth and fifth contact holes H4 and H5, respectively, and a forth electrode 144 electrically connecting the gate pad 112*c* and the data pad 120*d* through the sixth and seventh contact holes H6 and H7, respectively. Preferably, the second electrode 142 includes a first pattern connecting the gate electrode and the source and drain electrodes of the first transistor constituting the shift register to each other, and a second pattern connecting the gate electrode of the second transistor constituting the shift register to the source and drain electrodes of the third transistor. In the present embodiment, the second electrode 142 in the contact region and the forth electrode pattern 144 in the pad region electrically connect a portion of the gate pattern with a portion of the data pattern, so that the second and the forth electrodes 142 and 144 are regarded as the same kind of contact terminal.

It is preferred that the forth and fifth contact holes H4 and H5 are formed to have a line width wider than that of the branch wirings 160 to reduce the contact resistance between the third electrode and the main wirings 150 and the branch wirings 160. Further, the forth and fifth contact holes H4 and H5 are formed so as to be located in a liquid crystal layer region within a seal line used for attaching the TFT substrate to the color filter substrate or to be located under the seal line, thereby preventing metal corrosion from being caused when the seal line is exposed to an external atmosphere.

In a transmission type LCD device, the electrode patterns 140 and 142 are formed of a transparent conductive film, e.g., an indium-tin oxide ("ITO") film or an indium-zinc oxide ("IZO") film. In a reflection type LCD device, the electrode patterns are formed of an opaque conductive film having high reflectivity, e.g., aluminum alloy film or silver film.

Hereinafter, a method of manufacturing an amorphous silicon TFT-LCD device according to the present disclosure will be described in detail with reference to the accompanying drawings.

FIGS. 8A to 11B are plan views explaining a method of manufacturing an amorphous silicon TFT-LCD device according to the present disclosure. Here, each figure labeled "A" is a plan view illustrating a unit process in a gate driving circuit region, and each figure labeled "B" is a plan view illustrating a unit process in a display region.

Figure 8A:
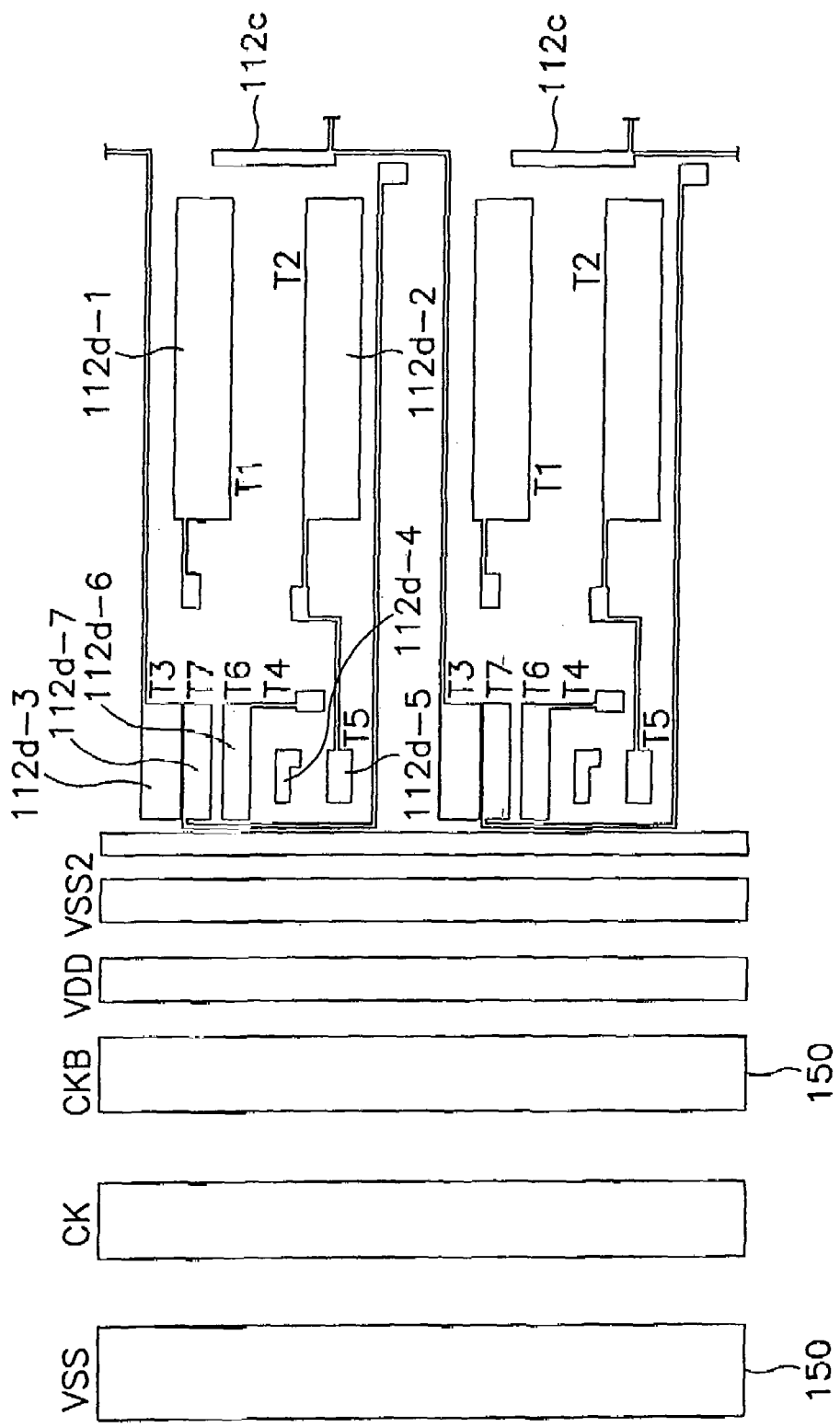
Figure 8B:
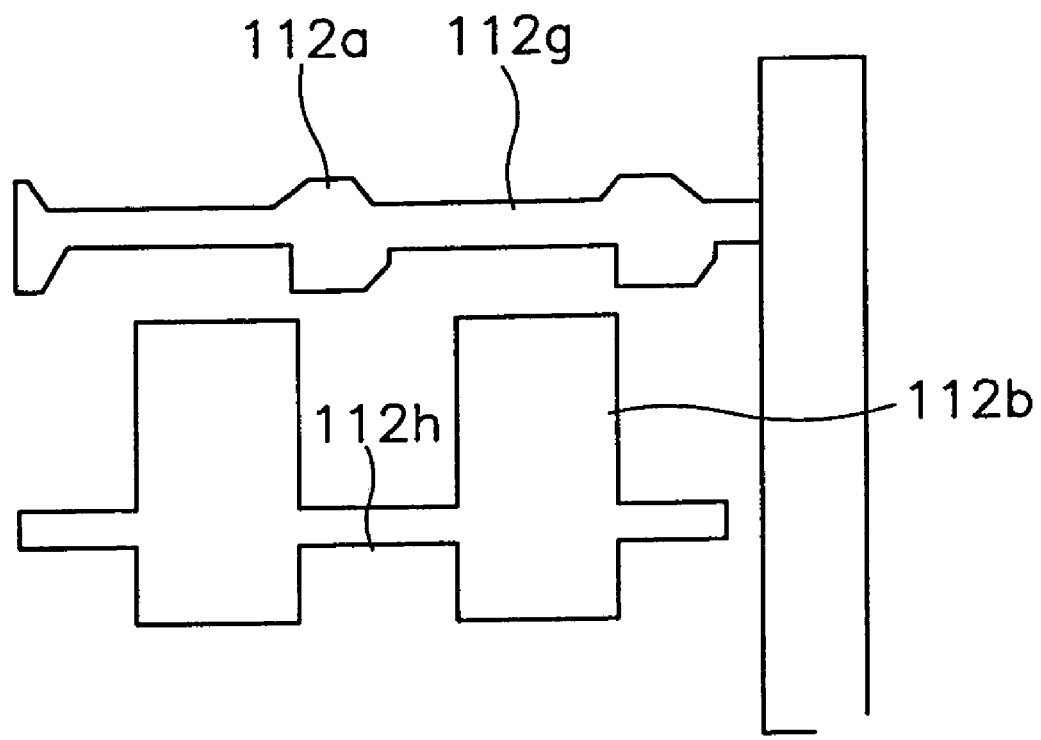

Referring to FIGS. 8A and 8B, a metal film comprising a chrome ("Cr") layer having a thickness of about 500 Å and an aluminum-neodymium ("AlNd") layer having a thickness of about 2500 Å is deposited on a substrate consisting of an insulating material such as glass, quartz or ceramic. Then, the metal film is patterned through a photolithography process using a first mask, thereby forming gate patterns 112.

The gate patterns 112 in the display region include a gate line 112g disposed in a first direction (e.g., a horizontal direction), a capacitor lower wiring 112h disposed between the adjacent gate lines 112g to be arranged parallel with the gate line 112g, a capacitor lower electrode 112b overlapped with the capacitor lower wiring and formed in the unit pixel region, and a gate electrode 112a branched from the gate line 112g. When the capacitor lower wiring 112h is formed separately from the gate line 112g as in this embodiment, the load capacitor of the gate output terminal of the shift register can be reduced to about ½ to ⅓ in comparison with the front gate structure.

Between the display region and the gate driving circuit region, there is formed a gate pad 112c comprised of the same layer as in the gate pattern. The gate pad 112c is connected to one end of the gate line 112g and applies a scanning signal received from an external source to the gate line 112g.

Gate electrodes 112d-1 and 112d-2 of a first driving transistor T1 and a second driving transistor T2 in each of the shift registers disposed on the gate driving circuit region, have a wider line width than those of the gate electrodes 112d-3, 112d-4, 112d-5, 112d-6 and 112d-7 of a third to a seventh control transistor T3 to T7.

Also, to minimize the wiring resistance, main wirings 159 comprised of the same layer as in the gate pattern 112 are formed on the substrate of the gate driving circuit region. Preferably, the main wirings 150 are formed of the same layer from the corresponding first shift register to the corresponding last shift register without an additional contact.

Figure 9A:
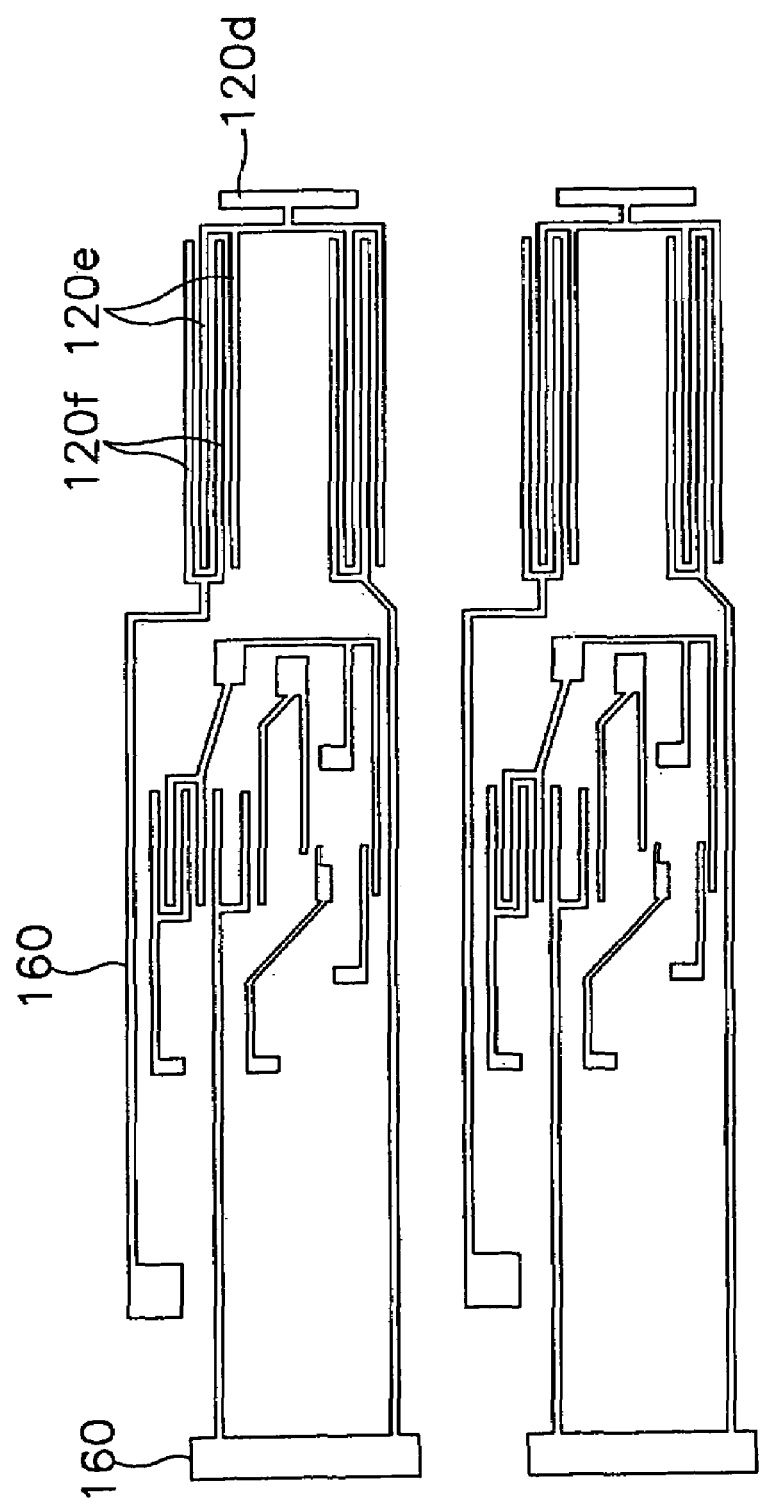
Figure 9B:
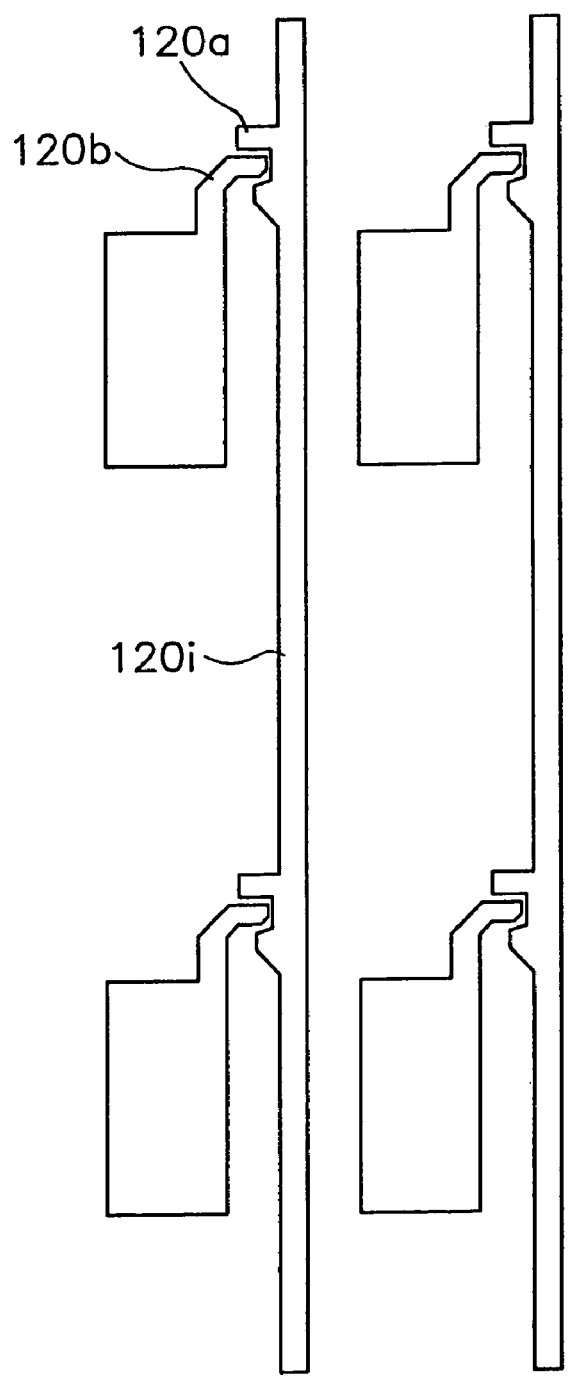

Referring to FIGS. 9A and 9B, after forming the gate patterns 112 and the main wirings 150 as described above, silicon nitride is deposited to a thickness of about 4500 Å by a Plasma Enhanced Chemical Vapor Deposition ("PECVD") method to thereby form a gate insulating film (see reference numeral 114 of FIG. 5).

Then, the active layer patterns (see reference numerals 116 and 118 in FIG. 5) are formed on the gate insulating film 114 through a photolithography process using a second mask. Specifically, an amorphous silicon film is deposited on the gate insulating film 114 to a thickness of about 2000 Å by PECVD, and an n+ doped amorphous silicon film is deposited to a thickness of about 500 Å by PECVD on the amorphous silicon film. Then, through a photolithography process using the second mask, the films are patterned to form the active layer patterns including a channel region 116 comprising the amorphous silicon film and first and second impurity regions (e.g., source and drain regions) 118 comprising the n+ doped amorphous silicon film. Here, the active layer pattern of the first and second driving transistors connected to the output terminal of the gate driving circuit region has a wider line width than those of the active layer pattern of the third to seventh control transistors.

Then, after depositing a chrome ("Cr") film to a thickness of about 1500 Å on the entire surface of the substrate including the active patterns 116 and 118, the chrome film is patterned through a photolithography process using a third mask. As a result, there are formed data patterns 120 including a data line 120i disposed in a second direction perpendicular to the gate line 112g (e.g., a vertical direction), and source and drain electrodes 120a and 120b, which are overlapped with the first and second impurity regions 118a and 118b, respectively. Here, to secure sufficient capacity, the drain electrode 120b is formed to be overlapped with the capacitor lower electrode 112i, as shown in FIGS. 9A and 9B.

As shown in FIG. 9A, a data pad 120d adjacent to the gate pad 112c is formed on the gate driving circuit region. The gate pad 112c and the data pad 120d are electrically connected to each other by a contact pattern that will be formed together with a pixel electrode of the display region. Further, on the substrate of the gate driving circuit region, the branch wirings 160 comprised of the same layer as in the data pattern 120 are formed to cross the main wirings 150. To reduce the capacitance of the main wirings 150, a portion of the branch wirings 160 where the branch wring 160 and the main wiring 150 cross each other is formed to have a narrow line width.

Preferably, the source and drain electrodes 120e and 120f of the first driving transistor T1 and the second driving transistor T2 of each of the shift registers disposed in the gate driving circuit region are formed to have an interdigital structure. In other words, the even-numbered electrodes 120e are commonly connected to the left-side source pad and the odd-numbered electrodes 120f are commonly connected to the right-side drain pad. The even-numbered electrodes 120e are disposed between the odd-numbered electrodes 120f. The interdigital structure of the source and drain electrodes of the first and second driving transistors T1 and T2 increases the channel width of the driving transistor within the limited area, so that a driving ability of the transistor comprising amorphous silicon can be sufficiently secured.

Referring to FIGS. 10A and 10B, after forming the data pattern 120 and the branch wirings 160 as described above, a passivation layer 130 is formed on the entire surface of the resultant structure. The passivation layer 130 is formed of an inorganic insulating material such as silicon oxide, silicon nitride or a combination thereof, or a photosensitive organic insulating material.

Then, the passivation layer 130 is partially etched away through a photolithography process using a fourth mask to thereby form contact holes H1 through H7. That is, there are formed a first contact hole H1 exposing the drain electrode 120b of the display region, a second contact hole H2 exposing the gate pattern 112f for contact in the gate driving circuit region, a third contact hole H3 exposing the data pattern 120h for contact in the gate driving circuit region, a fourth contact hole H4 exposing the main wiring 150 and a fifth contact hole exposing the branch wiring 160. In addition, there are formed sixth and seventh contact holes H6 and H7 exposing the gate pad 112c and the data pad 120d, respectively. The sixth and seventh contact holes H6 and H7 can be classified into the contact holes exposing the contact gate pattern and the contact holes exposing the contact data pattern, just like the second and third contact holes H2 and H3. Accordingly, the contact holes exposing the gate pad 112c are regarded as one of the second contact holes H2, and the contact holes exposing the data pad 112d are regarded as one of the third contact holes H3.

A pair of contact holes H2 and H3 formed adjacent to each other is electrically connected to each other by the contact electrode that will be formed together with a pixel electrode formed in the display region.

In a reflection type LCD device having a reflective electrode of an uneven structure, numerous uneven structures are formed in the surface of the passivation layer 130 during the formation of the contact holes.

Figure 11B:
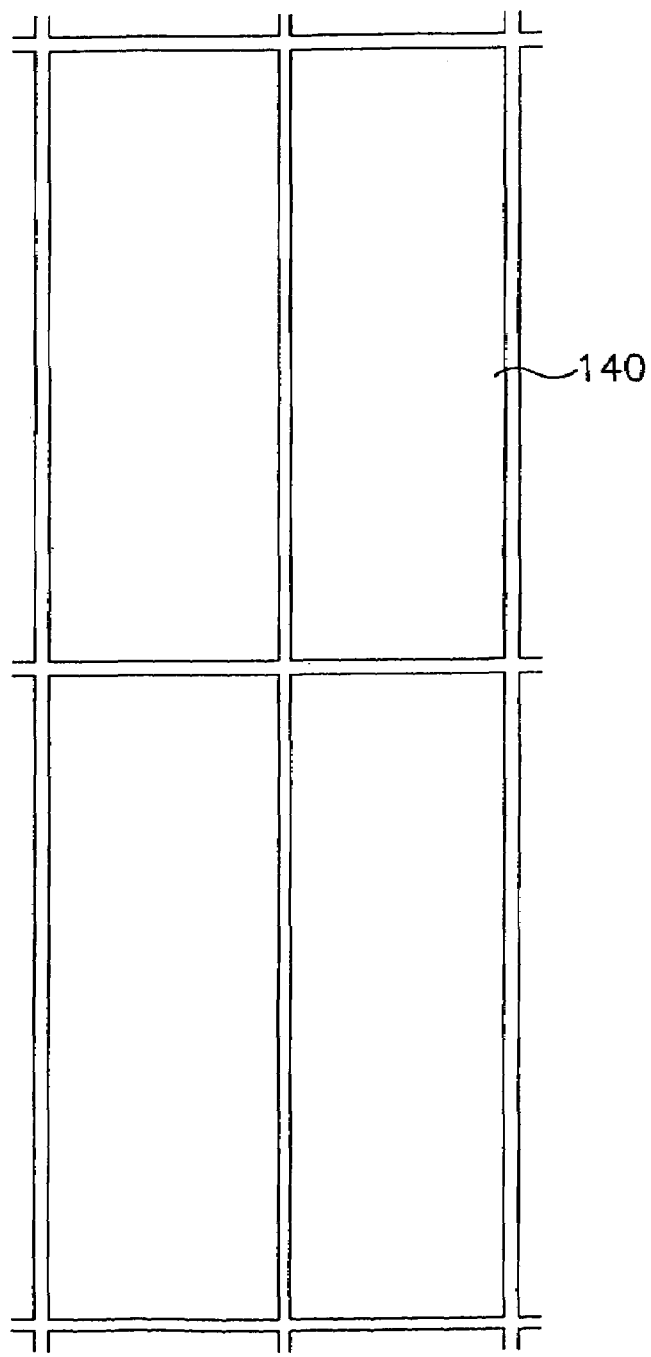

Referring to FIGS. 11A and 11B, after forming the contact holes as mentioned above, a metal film for pixel electrode, e.g., a transparent conductive film such as an ITO film or an IZO film, or an opaque reflective film such as an Al alloy film or a silver film, is deposited on the entire surface of the resultant structure. Then, the metal film is patterned through a photolithography process using a fifth mask, to thereby form the pixel electrode (or the first electrode) 140 electrically connected to the drain electrode 120b through the first contact hole H1 in the display region. In the gate driving circuit region, a second electrode 142 is formed so as to electrically connect the contact gate pattern 112f and the contact data pattern 112h through the second and third contact holes H2 and H3. In addition, a third electrode 143 is formed so as to electrically connect one of the main wirings 150 and one of the branch wirings 160 through the forth and fifth contact holes H4 and H5. In the pad region located between the display region and the gate driving circuit region, a fourth electrode 144 is formed so as to electrically connect the gate pad 112c and the data pad 112d through the sixth and seventh contact holes H6 and H7.

In the above-mentioned embodiment, the amorphous silicon TFT-LCD is manufactured using masks of 5 sheets. However, according to another embodiment of the present disclosure, the number of masks used for manufacturing an amorphous silicon TFT-LCD can be decreased down to 4 sheets by simultaneously forming active layer patterns and data patterns using one mask.

In detail, after forming the gate insulating film, an undoped intrinsic amorphous silicon film and an n-type doped extrinsic amorphous silicon film are successively deposited on the gate insulation film. After a metal film for data patterns is deposited on the entire surface of the extrinsic amorphous silicon film, a positive photosensitive film is coated to a predetermined thickness thereon and then, a mask is arranged above the photosensitive film.

In the mask, light-shielding regions correspond to source, drain and channel regions and light-transmitting regions correspond to the other regions. Particularly, the light-transmitting region between the channel region and the source region and the light-transmitting region between the channel region and the drain region have a slit structure. Since light passing through theses slits is diffracted, the gap of the slits is controlled narrower than that of the channel region. The ultraviolet rays passing the slit are diffracted to expose the photosensitive film located on the channel region. At the same time, the exposed photosensitive film of the other region is exposed to the UV rays.

The exposed photosensitive film is developed to form a photosensitive pattern where a portion corresponding to the channel region is removed to a predetermined depth. When the dry etching process is performed using the photosensitive pattern as an etching mask, the exposed metal film on which no photosensitive film is coated and the underlying extrinsic amorphous silicon film and intrinsic amorphous silicon film are removed away. At this time, the photosensitive film pattern on the channel region is also removed because it has a very thin thickness during the development process.

Next, the exposed metal film of the channel region and the underlying extrinsic amorphous silicon film are completely removed by a selective etching method, while the underlying intrinsic amorphous silicon film is removed to a predetermined depth. Thereafter, the photosensitive film pattern on the source and drain regions is removed to simultaneously form the active patterns and the data patterns including the source and drain electrodes using one mask process.

According to the present disclosure as described above, without an additional process, the gate driving circuit including the shift registers and the wirings is integrated on the insulating substrate on which a pixel array is formed. That is, several layers, which can be comprised of the same material, are formed of the same layer to thereby decrease the number of masks. Further, a conductive film for pixel electrodes connects the gate electrode and source and drain electrodes of the first transistor constituting the shift registers in the gate driving circuit with each other, thereby simplifying the manufacturing process.

Further, the main wirings for applying signals to the shift registers are formed of the same layer from the first shift register to the last shift register, so that the resistance of the main wirings is minimized to increase a field effect of the amorphous silicon TFT-LCD.

Although exemplary preferred embodiments of the present disclosure have been described, it is to be understood that the present disclosure should not be limited to those preferred embodiments, but that various changes and modifications can be made by one skilled in the art while remaining within the spirit and scope of the disclosure as hereinafter claimed.

What is claimed is:

1. A substrate for a display device, comprising:
    a base substrate including a display region and a driving circuit region;
    a plurality of switching transistors formed in the display region, each of the switching transistors including amorphous silicon;
    a plurality of driving transistors formed in the driving circuit region, each of the driving transistors including amorphous silicon;
    a protection layer formed on the base substrate to cover the switching transistors and the driving transistors;
    an electrode pattern formed on the protection layer, the electrode pattern including a pixel electrode electrically connected to one of the switching transistors, and a connecting electrode electrically connecting two of the driving transistors; and
    main signal lines for applying signals to the driving transistors,
    wherein the main signal lines comprise a first signal line being adjacent to the driving transistors and having a first width, and a second signal line being adjacent to the first signal line having a second width that is wider than the first width.

2. The substrate of claim 1, wherein the electrode pattern comprises an optically transparent and electrically conductive material.

3. The substrate of claim 2, wherein the electrode pattern comprises at least one of ITO (Indium Tin Oxide) and IZO (Indium Zinc Oxide).

4. The substrate of claim 1, wherein each of the driving transistors and the switching transistors comprises a gate electrode, a drain electrode and a source electrode, and the gate electrode and the main signal lines are made of a same material.

5. The substrate of claim 4, further comprising a branch signal line extended from one of the drain electrode and the source electrode, the branch signal line including a wiring portion having a third width, and a connecting pad portion having a fourth width that is wider than the third width.

6. The substrate of claim 5, wherein the connecting pad portion is electrically connected to the connecting electrode.

7. A liquid crystal display (LCD) device comprising:
a first substrate including:
a base substrate including a display region and a driving circuit region;
a plurality of switching transistors formed in the display region, each of the switching transistors including amorphous silicon;
a plurality of driving transistors formed in the driving circuit region, each of the driving transistors including amorphous silicon; and
a protection layer formed on the base substrate to cover the switching transistors and the driving transistors;
an electrode pattern formed on the protection layer, the electrode pattern including a pixel electrode electrically connected to one of the switching transistors, and a connecting electrode electrically connecting two of the driving transistors; and
main signal lines for applying signals to the driving transistors; a second substrate facing the first substrate; and
a liquid crystal layer disposed between the first and the second substrates,
wherein the main signal lines comprise a first signal line being adjacent to the driving transistors and having a first width, and a second signal line being adjacent to the first signal line having a second width that is wider than the first width.

8. The LCD device of claim 7, wherein the electrode pattern comprises an optically transparent and electrically conductive material.

9. The substrate of claim 8, wherein the electrode pattern comprises at least one of ITO (Indium Tin Oxide) and IZO (Indium Zinc Oxide).

10. The LCD device of claim 7, wherein each of the driving transistors and the switching transistors comprises a gate electrode, a drain electrode and a source electrode, and the gate electrode and the main signal lines are made of a same material.

11. The LCD device of claim 10, further comprising a branch signal line extended from one of the drain electrode and the source electrode, the branch signal line including a wiring portion having a third width, and a connecting pad portion having a fourth width that is wider than the third width.

12. The LCD device of claim 11, wherein the connecting pad portion is electrically connected to the connecting electrode.

13. A method of manufacturing a substrate for a display device, comprising:
forming a gate electrode layer on a base substrate having a display region and a driving circuit region;
patterning the gate electrode layer to form gate electrodes of switching transistors in the display region, gate electrodes of driving transistors in the driving circuit region and a main signal line in the driving circuit region;
forming a gate insulation layer on the base substrate to cover the gate electrodes of the driving transistors and the switching transistors, and the main signal line;
forming an active layer pattern on the gate insulation layer;
forming a data electrode layer on the active layer pattern and the gate insulation layer;
patterning the data electrode layer to form drain and source electrodes of the switching transistors in the display region, drain and source electrodes of the driving transistors in the driving circuit region, and a branch signal line extended from one of the drain and source electrodes of the driving transistors;
forming a passivation layer on the base substrate;
forming a first contact hole through the passivation layer that exposes a portion of the main signal line, and a second contact hole through the passivation layer that exposes a portion of the branch signal line;
forming a electrode layer on the passivation layer; and
patterning the electrode layer to form pixel a electrode electrically connected to one of the drain electrodes of the switching transistors, a first connecting electrode connecting two of the driving transistors, and a second connecting electrode connecting the main signal line and one of the driving transistors.

14. The method of claim 13, wherein the pixel electrode pattern comprises metal.

15. The method of claim 13, wherein the electrode pattern comprises an optically transparent and electrically conductive material.

16. The method of claim 13, wherein the gate electrode layer comprises a chromium (Cr) metal layer and aluminum (Al)-including metal layer.

17. The method of claim 16, wherein a thickness of the aluminum-including metal layer is thicker than a thickness of the chromium metal layer.

18. The method of claim 13, wherein the data electrode layer comprises a chromium metal layer and has a thickness of about 1500 angstroms to about 4000 angstroms.

* * * * *